United States Patent
Tokuda et al.

(10) Patent No.: US 9,954,041 B2
(45) Date of Patent: Apr. 24, 2018

(54) ORGANIC ELECTROLUMINESCENCE DISPLAY DEVICE

(71) Applicant: Japan Display Inc., Tokyo (JP)

(72) Inventors: Naoki Tokuda, Tokyo (JP); Mitsuhide Miyamoto, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/559,965

(22) Filed: Dec. 4, 2014

(65) Prior Publication Data

US 2015/0162394 A1 Jun. 11, 2015

(30) Foreign Application Priority Data

Dec. 5, 2013 (JP) ................................. 2013-251927

(51) Int. Cl.
*H01L 27/32* (2006.01)

(52) U.S. Cl.
CPC ........ *H01L 27/3248* (2013.01); *H01L 27/326* (2013.01); *H01L 27/3218* (2013.01)

(58) Field of Classification Search
CPC ............. H01L 27/3258; H01L 27/3248; H01L 27/326
See application file for complete search history.

(56) References Cited

U.S. PATENT DOCUMENTS

| | | | |
|---|---|---|---|
| 2002/0125820 A1 | 9/2002 | Sheu et al. | |
| 2003/0227038 A1* | 12/2003 | Kikuchi et al. | 257/291 |
| 2004/0222740 A1* | 11/2004 | Kim | 313/506 |
| 2009/0243971 A1* | 10/2009 | Uehara | 345/32 |
| 2009/0302729 A1* | 12/2009 | Amelung | F21S 2/005 313/1 |

FOREIGN PATENT DOCUMENTS

| | | |
|---|---|---|
| CN | 101958102 B | 1/2013 |
| JP | 2002-216960 A | 8/2002 |
| JP | 2004-165598 A | 6/2004 |
| JP | 2009-109520 A | 5/2009 |
| JP | 2012-216495 A | 11/2012 |
| WO | 2013/014883 A1 | 1/2013 |

OTHER PUBLICATIONS

Japanese Office Action dated Feb. 7, 2017, for corresponding JP application No. 2013-251927. With Partial English Translation.
Taiwanese Office Action, dated Feb. 18, 2016, for corresponding Taiwanese Patent Application No. 103139435.

* cited by examiner

*Primary Examiner* — Brigitte Paterson
(74) *Attorney, Agent, or Firm* — Typha IP LLC (57) ABSTRACT

An organic electroluminescence display device includes a substrate; a thin film transistor that is formed on the substrate; a light emitting region that has a lower electrode, a light emitting layer, and an upper electrode formed for each of a plurality of pixels arranged in a matrix shape on the thin film transistor; and a contact hole that is formed on the outside of the light emitting region in one corner portion of the pixel and connects the thin film transistor and the lower electrode for each pixel in a plan view. Only one pair of pixels of four pixels that share an intersection point of boundaries of the pixels arranged in the matrix shape, which are arranged in a diagonal manner have the contact holes at the corner portions having the intersection point.

5 Claims, 7 Drawing Sheets

ORGANIC ELECTROLUMINESCENCE DISPLAY DEVICE

CROSS-REFERENCE TO RELATED APPLICATION

The present application claims priority from Japanese application JP 2013-251927 filed on Dec. 5, 2013, the content of which is hereby incorporated by reference into this application.

BACKGROUND OF THE INVENTION

1. Field of the Invention

The present invention relates to an organic electroluminescence display device.

2. Description of the Prior Art

As a lightweight and thin light emitting source, an organic electro luminescent light emitting element has attracted attention and an image display apparatus including a plurality of organic electro luminescent light emitting elements has been developed. The organic electro luminescent light emitting element has a structure in which an organic layer having a light emitting layer is sandwiched between a lower electrode and an upper electrode.

As such an organic electro luminescent light emitting element, a configuration having the lower electrode formed in each pixel, the organic layer, and the upper electrode is disclosed in JP 2002-216960 A. The lower electrodes of the organic electro luminescent light emitting elements are respectively connected to a thin film transistor through contact holes.

SUMMARY OF THE INVENTION

Figure 7:
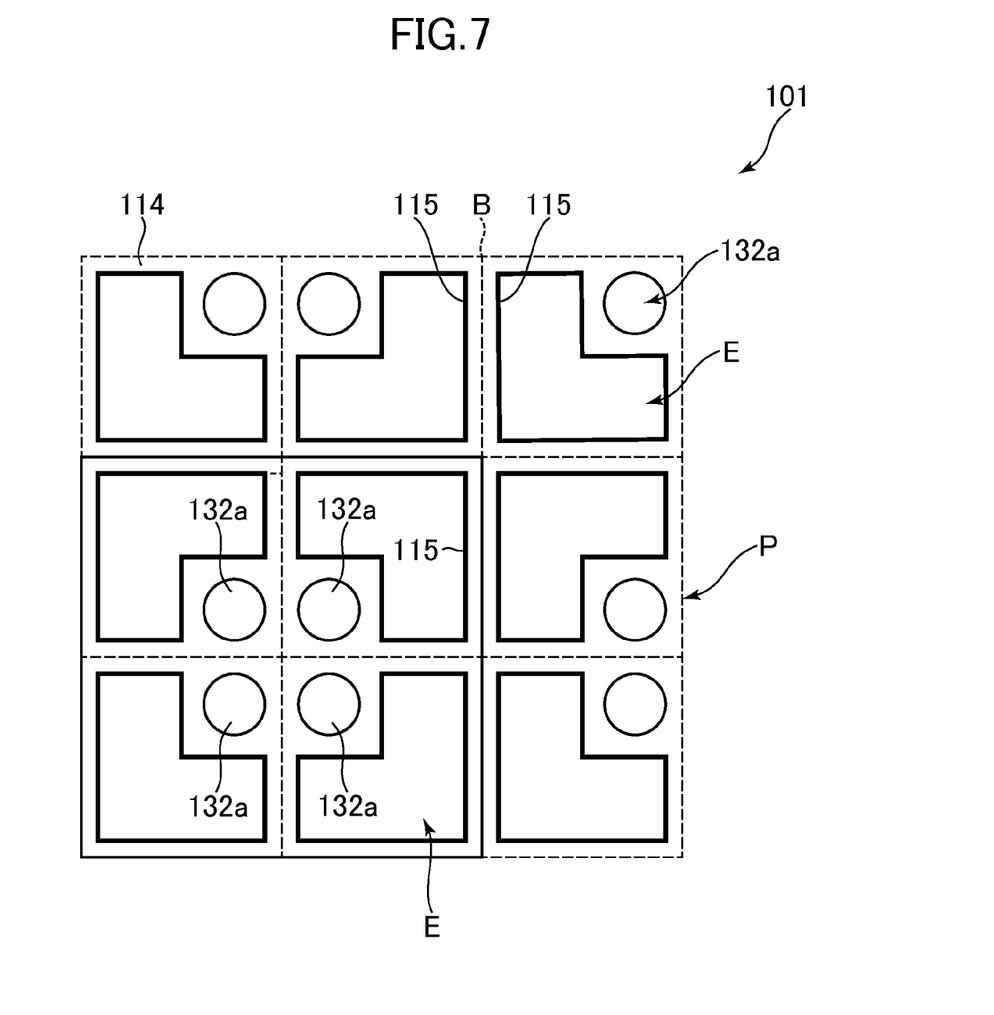
FIG. 7 is a partial enlarged plan view illustrating an organic electroluminescence display device of the related art.

FIG. 7 is a partial enlarged plan view illustrating an organic electroluminescence display device 101 of the related art. In a configuration described in FIG. 7, aside surface (inclined surface) 115 of a pixel separation film 114 is inclined with respect to an upper surface of an organic layer. Thus, in the side surface 115, there is a concern that some of light emitted from a light emitting region E in which the organic layer is provided is reflected in a direction of an adjacent pixel P and color mixture is caused.

Furthermore, as illustrated in FIG. 7, if contact holes 132a are arranged so as to be adjacent to each other across a boundary B between the pixels P, the side surfaces 115 of the pixel separation films 114 are adjacent to each other. Thus, in the side surfaces 115, the light is reflected on the side of the adjacent pixel P and the color mixture likely to occur.

The invention is made in view of such circumstances and an object of the invention is to realize suppression of color mixture of an organic electroluminescence light emitting element.

Among the inventions disclosed in the present application, an outline of a representative configuration is described as follows.

(1) An organic electroluminescence display device according to an aspect of the invention includes: a substrate; a thin film transistor that is formed on the substrate; a light emitting region that has a lower electrode, a light emitting layer, and an upper electrode formed for each of a plurality of pixels arranged in a matrix shape on the thin film transistor; and a contact hole that is formed on the outside of the light emitting region in one corner portion of the pixel and connects the thin film transistor and the lower electrode for each pixel in a plan view. Only one pair of pixels of four pixels that share an intersection point of boundaries of the pixels arranged in the matrix shape, which are arranged in a diagonal manner have the contact holes at the corner portions having the intersection point.

(2) In the organic electroluminescence display device described in (1), only the pair of pixels of the four pixels, which are arranged in a diagonal manner, may have the contact holes at the corner portions of the diagonal of the intersection point.

(3) In the organic electroluminescence display device described in (1), the light emitting region may be an L shape in a plan view.

(4) In the organic electroluminescence display device described in (1), the light emitting region may be a rectangular shape in a plan view.

(5) In the organic electroluminescence display device described in (1), the light emitting region may be a triangular shape in a plan view.

DETAILED DESCRIPTION OF THE INVENTION

Hereinafter, for an organic electroluminescence display device, an organic electroluminescence display device 1 according to an embodiment will be described with reference to the drawings as an example. Moreover, in the drawings referred to in the following description, in order to facilitate understanding of features, for the sake of convenience, portions of the features may be illustrated by being enlarged and a dimensional ratio and the like of each configuration element are not necessarily the same as the actual. Furthermore, in the following description, an illustrated material and the like are an example, each configuration element may have different material from the exemplified material, and each configuration element can be modified within a range not changing the gist thereof.

Figure 1:
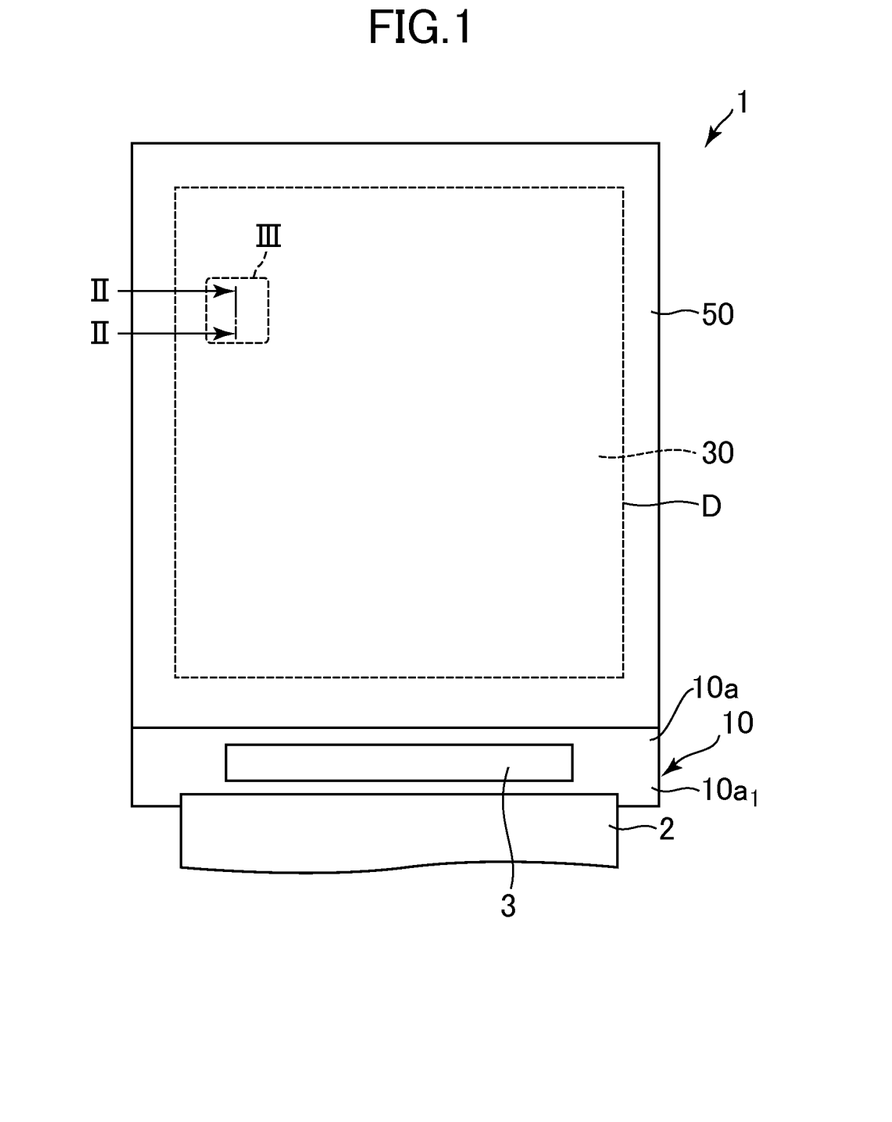
FIG. 1 is a schematic plan view of an organic electroluminescence display device according to an embodiment of the invention.

FIG. 1 is a schematic plan view of the organic electroluminescence display device 1 according to an embodiment of the invention. A counter substrate 50 is disposed in a display region D in an upper surface 10a of a substrate 10, which is a region in which an image is displayed. Furthermore, a region $10a_1$ in which the counter substrate 50 is not disposed is connected to a flexible circuit substrate 2 and is provided with a driver integrated circuit (IC) 3.

The driver IC 3 is an IC that supplies image data from the outside of the organic electroluminescence display device 1 through the flexible circuit substrate 2 and is disposed on the substrate 10. The driver IC 3 supplies a voltage signal applied to each pixel to an organic electroluminescence light emitting element 30 through a data line (not illustrated) by supplying the image data.

Figure 2:
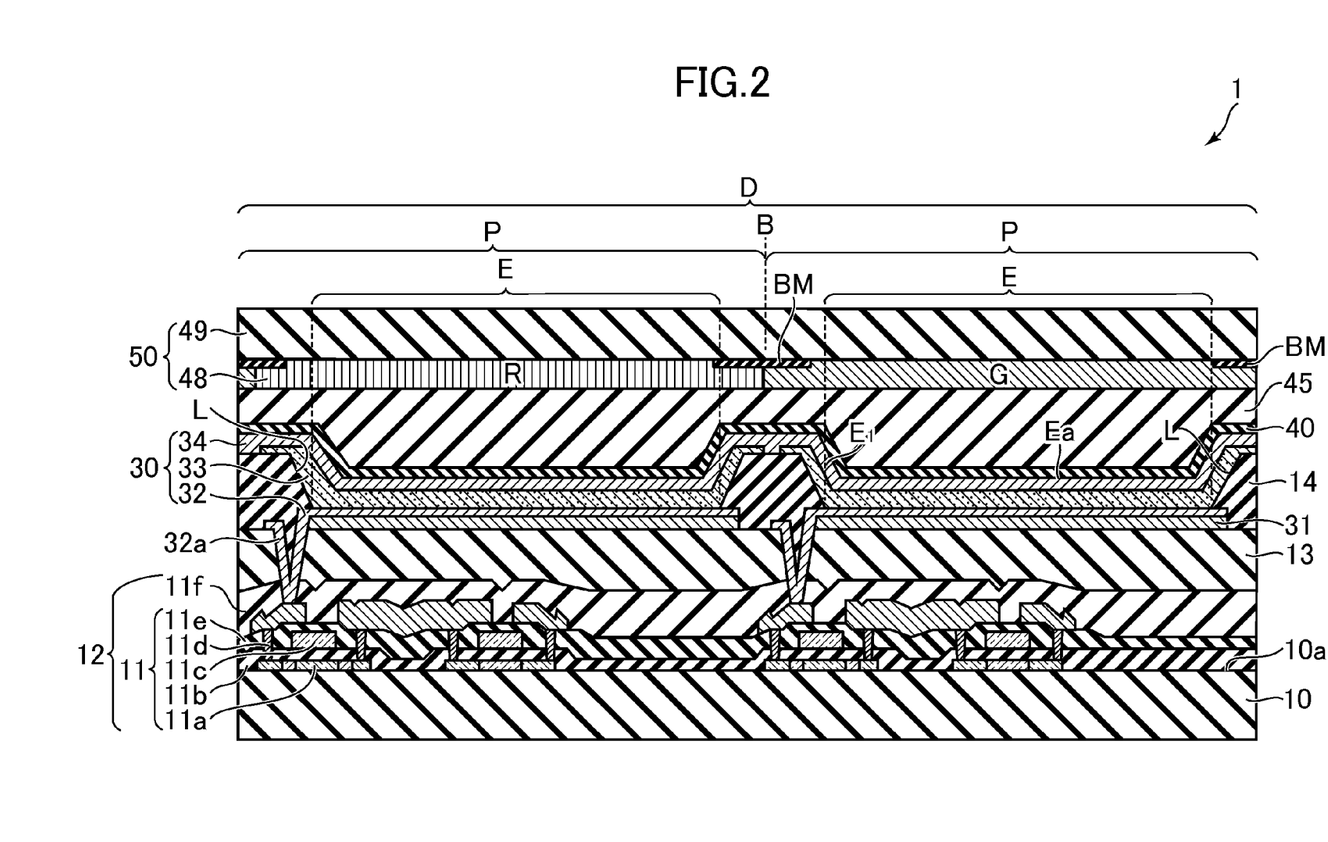
FIG. 2 is a schematic cross-sectional view of the organic electroluminescence display device illustrated in FIG. 1, which is taken along a section line II-II.

Next, a configuration of the display region D of the organic electroluminescence display device 1 will be described in detail. FIG. 2 is a schematic cross-sectional view of the organic electroluminescence display device 1 illustrated in FIG. 1, which is taken along a section line II-II. As illustrated in FIG. 2, a circuit layer 12 in which a thin film transistor 11 and electrical wiring (not illustrated) are formed, a planarization layer 13, the organic electroluminescence light emitting element 30 that is formed on the thin film transistor 11 through the planarization layer 13, a sealing film 40, a filler 45, and the counter substrate 50 are laminated on the substrate 10 of the display region D. Furthermore, a plurality of pixels P are disposed on the substrate 10 in a matrix shape.

The substrate 10 is an insulating substrate and the circuit layer 12 and the organic electroluminescence light emitting element 30 are formed on the upper surface 10a in this order.

The circuit layer 12 is a layer in which the thin film transistor 11, a passivation film 11f and the electrical wiring (not illustrated) are formed. The circuit layer 12 is formed to drive the organic electroluminescence light emitting element 30. The thin film transistor 11 is provided for each pixel P. Specifically, for example, the thin film transistor 11 has a poly-silicon semiconductor layer 11a, a gate insulating layer 11b, a gate electrode 11c, a source-drain electrode 11d, and a first insulation film 11e. Furthermore, the passivation film 11f that is an insulation film protecting the thin film transistor 11 covers the thin film transistor 11.

The planarization layer 13 is formed so as to cover the circuit layer 12. The planarization layer 13 is a layer formed of an insulation material. The planarization layer 13 is formed between the substrate 10 and the organic electroluminescence light emitting element 30 such that a portion between the thin film transistor 11 and the organic electroluminescence light emitting element 30 is electrically insulated. For example, the planarization layer 13 is formed of an insulation material such as $SiO_2$ or SiN, acrylic, or polyimide.

A reflective film 31 may be formed in a region corresponding to each pixel P on the planarization layer 13. The reflective film reflects the light emitted from the organic electroluminescence light emitting element 30 toward the counter substrate 50. It is preferable that a material of the reflective film 31 have high optical reflectance and, for example, it is preferable that the reflective film 31 be a metal film formed of aluminum or silver (Ag), and the like.

A plurality of organic electroluminescence light emitting elements 30 are formed on the planarization layer 13 for each pixel P. The organic electroluminescence light emitting element 30 has a lower electrode 32, an organic layer 33 having at least a light emitting layer and an upper electrode 34 formed so as to cover the organic layer 33, and thereby a region in which the organic layer 33, the lower electrode 32, and the upper electrode 34 are overlapped functions as the light emitting region E.

The lower electrode 32 is an electrode for injecting a driving current to the organic layer 33. The lower electrode 32 is connected to a contact hole 32a. Thus, the lower electrode 32 is electrically connected to the thin film transistor 11 and supplies the driving current to the thin film transistor 11.

The lower electrode 32 is formed of a conductive material. Specifically, for example, it is preferable that the material of the lower electrode 32 be indium tin oxide (ITO) and may be a material which has translucency and conductivity such as indium zinc complex oxide (IZO), tin oxide, zinc oxide, indium oxide, and aluminum oxide composite oxide. Moreover, the lower electrode 32 may have translucency as long as the reflective film is formed of metal such as silver and comes into contact with the lower electrode 32. In such a configuration, the reflective film functions as a part of the lower electrode 32.

For example, a pixel separation film 14 is formed between adjacent lower electrodes 32 along the boundary B between adjacent pixels P. The pixel separation film 14 prevents contact between adjacent lower electrodes 32 and a leakage current between the lower electrode 32 and the upper electrode 34. The pixel separation film 14 is formed of an insulation material and, specifically, for example, is formed of a photosensitive resin composition. A side surface (inclined surface) L of the pixel separation film 14 is formed along an outer periphery $E_1$ of the light emitting region E. The inclined surface L is inclined with respect to an upper surface Ea of the light emitting region E.

The organic layer 33 is a layer formed of an organic material having at least the light emitting layer. The organic layer 33 is formed so as to cover a plurality of lower electrodes 32 and the pixel separation film 14. The organic layer 33 may be formed so as to cover an entire surface of a region of the display region D in which the pixels P are disposed. The organic layer 33 has a layer that emits the light and the emitted light may be white or other colors.

For example, in the organic layer 33, a hole injection layer, a hole transport layer, a light-emitting layer, an electron transport layer, and an electron injection layer (not illustrated) are laminated in this order from the side of the lower electrode 32. Moreover, a laminated structure of the organic layer 33 is not limited to those described here and the laminated structure is not specifically limited as long as it includes at least the light emitting layer.

The light emitting layer is configured of an organic electroluminescence material that emits light by combining positive holes and electrons. For example, as such an organic electroluminescence material, those generally used as an organic light emitting material may be used.

The upper electrode 34 is formed so as to cover the organic layer 33. The upper electrode 34 is not independent for each pixel P, but is formed so as to cover an entire surface of a region of the display region D in which the pixels P are disposed. The upper electrode 34 comes into contact with the organic layer 33 of the plurality of organic electroluminescence light emitting elements 30 by having such a configuration.

The upper electrode 34 is formed of a material having translucency and conductivity. Specifically, for example, it is preferable that the material of the upper electrode 34 be ITO or may be one obtained by mixing metal such as silver or magnesium into a conductive metal oxide such as ITO or InZnO, or one obtained by laminating a metal thin film such as silver or magnesium and the conductive metal oxide.

The sealing film 40 covers the upper surface of the upper electrode 34 over a plurality of pixels P. The sealing film 40 is formed in order to prevent oxygen and moisture penetration into each layer including the organic layer 33. A material of the sealing film 40 is not specifically limited as long as it is a transparent material having an insulating property.

The counter substrate 50 covers the upper surface of the sealing film 40, for example, through the filler 45. The counter substrate 50 is a substrate having an outer periphery smaller than the substrate 10 in a plan view. The counter substrate 50 is disposed so as to face the substrate 10. As such a counter substrate 50, for example, if the light emitting layer of the organic layer 33 emits white light, it is possible to use a color filter substrate. In the embodiment, an example in which the counter substrate 50 is the color filter substrate is described.

The counter substrate 50 is divided corresponding to each pixel P by a black matrix BM formed along the boundary B. For example, the counter substrate 50 has a color filter 48 and a glass substrate 49. The color filter 48 corresponds to each pixel P and, for example, is divided into an R region, a B region, and a G region by the black matrix BM.

Figure 3:
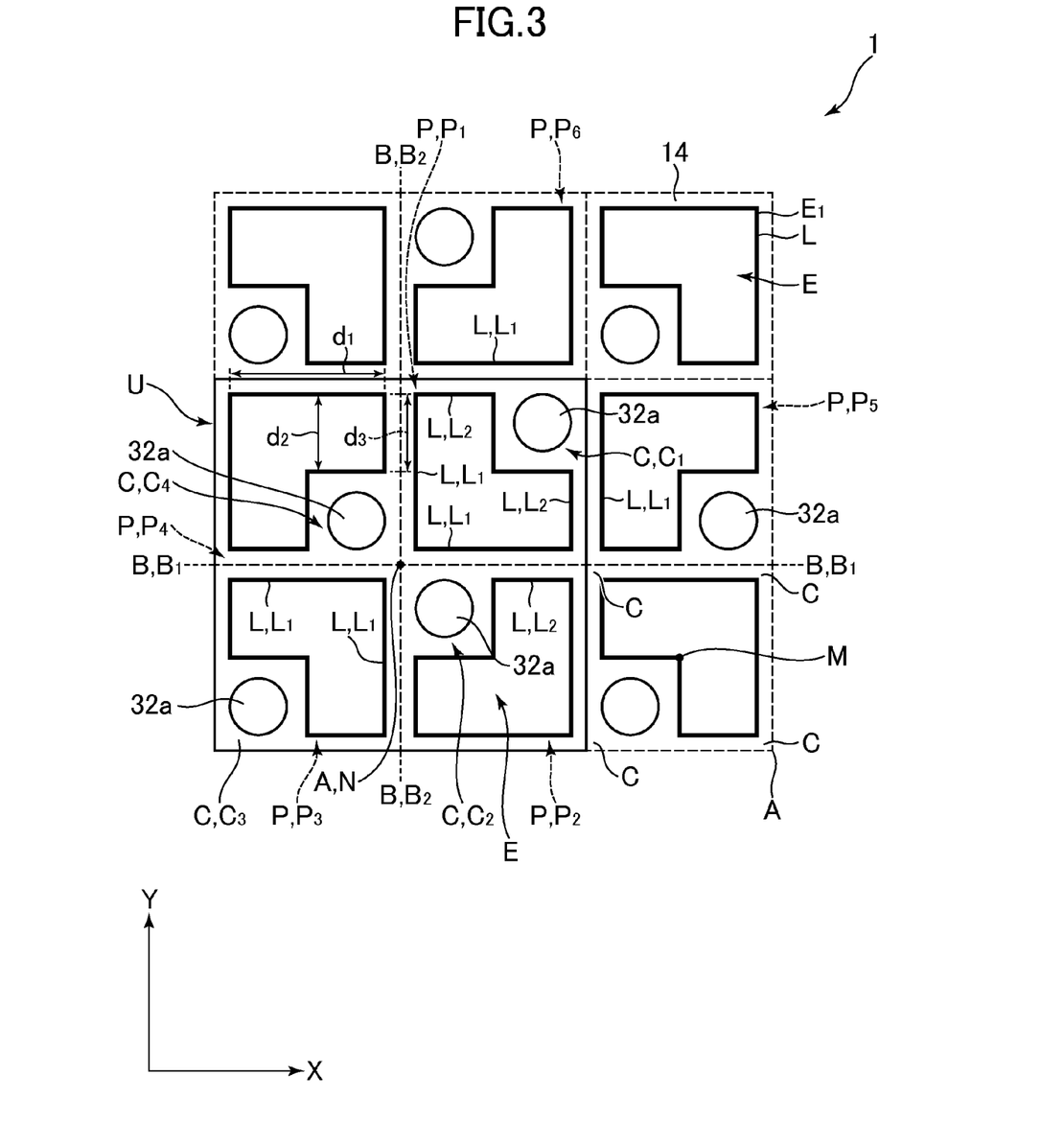
FIG. 3 is a partial enlarged view of a region III of the organic electroluminescence display device illustrated in FIG. 1.

Next, a positional relationship between the contact hole 32a and the light emitting region E will be described in detail. FIG. 3 is a partial enlarged view of a region III of the organic electroluminescence display device 1 illustrated in FIG. 1. Moreover, for the sake of convenience of the description, only the pixel separation film 14, the contact hole 32a, and the light emitting region E are illustrated in FIG. 3.

In the embodiment, the pixel P is a rectangular shape in a plan view and has four corner portions C. The light emitting region E and the contact hole 32a are formed for each pixel P and the contact hole 32a is disposed so as not to overlap with the light emitting region E in a plan view. Specifically, the contact hole 32a is positioned on the outside of the light emitting region E in the pixel P in a plan view.

Furthermore, the contact hole 32a is formed in one corner portion C of four corner portions C of each pixel P. Moreover, in the embodiment, "the corner portion C" indicates each region of four substantially rectangular shapes when dividing the pixel P so as to form four substantially rectangular shapes through a center M of the pixel P. For example, when four corners of the outer periphery of the pixel P are respectively referred to as a corner A, the center M and the corner A are respective diagonals of the four substantially rectangular shapes.

Hereinafter, a boundary between the pixels P is referred to as the boundary B and the intersection point between a boundary $B_1$ extending in an X direction and a boundary $B_2$ extending in a Y direction is referred to as an intersection point N. Furthermore, for the sake of convenience of description, four pixels P sharing the intersection point N are referred to as a pixel unit U.

For example, the pixel unit U illustrated in FIG. 3 is configured of a first pixel $P_1$, a second pixel $P_2$ sharing the boundary $B_1$ with the first pixel $P_1$, a third pixel $P_3$ disposed in a diagonal manner of the first pixel $P_1$ in the pixel unit U, and a fourth pixel $P_4$ disposed in a diagonal manner of the second pixel $P_2$ in the pixel unit U.

In the pixel unit U, only a pair of pixels P disposed in a diagonal manner has the contact holes 32a respectively at the corner portion C sharing the intersection point N. Specifically, for example, in the pixel unit U, only the second pixel $P_2$ and the fourth pixel $P_4$ of four pixels P respectively have the contact hole 32a at the corner portion C (a corner portion $C_2$ and a corner portion $C_4$ illustrated in FIG. 3) sharing the intersection point N.

Thus, the corner portion $C_2$ in the second pixel $P_2$ is adjacent to the light emitting region E of the first pixel $P_1$ and the light emitting region E of the third pixel $P_3$ across the boundary B between adjacent pixels P. Similarly, the corner portion $C_4$ in the fourth pixel $P_4$ is also adjacent to the light emitting region E of the first pixel $P_1$ and the light emitting region E of the third pixel $P_3$ across the boundary B between adjacent pixels P.

Furthermore, when a long side is referred to as $L_1$ and a short side is referred to as $L_2$ in each side of the side surface L (outer periphery $E_1$ of the light emitting region E) of the pixel separation film 14, the long side $L_1$ of the light emitting region E in the first pixel $P_1$ and the short side $L_2$ of the light emitting region E of the second pixel $P_2$ are adjacent through the boundary B and are parallel to each other. Moreover, in the embodiment, "parallel" includes not only a completely parallel configuration but also includes those displaced in an error range from the parallel by a manufacturing process.

When a length of the long side $L_1$ is referred to as a length $d_1$, a length of the short side $L_2$ is referred to as a length $d_2$, and a length of an adjacent (arranged in parallel) portion across the boundary B between the adjacent outer peripheries $E_1$ of the adjacent light emitting regions E across the boundary B is referred to as $d_3$, a relationship of sizes of the length $d_1$, the length $d_2$, and the length $d_3$ becomes $d_1 > d_2 \geq d_3$.

In the organic electroluminescence display device 1 in the embodiment, the length $d_3$ of the adjacent portion across the boundary B between the adjacent outer peripheries $E_1$ of the adjacent light emitting regions E of the pixels P (the long side $L_1$ and the short side $L_2$) across the boundary B is shorter than the length $d_1$ of the portion between side surfaces L of adjacent pixels P across the boundary B of an organic electroluminescence display device (all of four pixels P of the pixel unit U have the contact hole 32a at the corner portion C having the intersection point N) which does not have this configuration, by having this configuration.

The side surface L of the pixel separation film 14 is formed along the outer periphery $E_1$ of the light emitting region E. Thus, in the organic electroluminescence display device 1 in the embodiment, it is possible to suppress that the light emitted from the light emitting region E is reflected on the side surface L of the pixel separation film 14 and reaches the adjacent pixel P. Thus, it is possible to realize suppression of the color mixture of the organic electroluminescence display device 1.

Furthermore, since two pixels P (the second pixel $P_2$ and fourth pixel $P_4$) of four pixels P of the pixel unit U, which are disposed in a diagonal manner have the contact hole 32a at the corner portion C having the intersection point N, it is possible to suppress a decrease of a storage capacity more than that of the organic electroluminescence display device in which the contact holes are not adjacent in adjacent pixels.

Furthermore, in the embodiment, it is preferable that only the pair of pixels P of four pixels P, which are disposed in a diagonal manner have the contact hole 32a at the corner portion C positioned in the diagonal of the intersection point N. Specifically, for example, in the pixel unit U in the embodiment, only the first pixel $P_1$ and the third pixel $P_3$ of four pixels P have the contact hole 32a at the corner portion C (the corner portion $C_1$ and the corner portion $C_3$ illustrated in FIG. 3) positioned in the diagonal of the intersection point N.

In the organic electroluminescence display device 1 in the embodiment, the light emitting region of the contact hole 32a at the corner portion C positioned in the diagonal of the intersection point N and the light emitting region E of the pixel P adjacent to the contact hole 32a are adjacent across the boundary B, by having this configuration. Specifically, the short side $L_2$ of the outer periphery $E_1$ of the light emitting region E of the first pixel $P_1$ is adjacent across the boundary B and disposed parallel to the long side $L_1$ of the outer peripheries $E_1$ of the light emitting region E of the adjacent pixel P (pixels $P_5$ and $P_6$ in FIG. 3).

Thus, in the organic electroluminescence display device 1 in the embodiment, the length of the adjacent portion where the outer peripheries $E_1$ (long side $L_1$ and the short side $L_2$) of the adjacent light emitting regions E across the boundary B are adjacent through the boundary B is shorter than that of the organic electroluminescence display device which does not have this configuration. Thus, it is possible to suppress that the light emitted from the light emitting region E is reflected on the side surface L formed along the outer periphery $E_1$ and reaches the adjacent pixel P. Thus, it is possible to realize suppression of the color mixture of the organic electroluminescence display device 1.

Furthermore, in the organic electroluminescence display device 1 in the embodiment, as illustrated in FIG. 3, it is preferable that the outer periphery $E_1$ of the light emitting region E have the long side $L_1$ and the short side $L_2$, and that the shape thereof in a plan view be an L shape.

In the organic electroluminescence display device 1 in the embodiment, it is possible to increase a ratio of the area of the light emitting region E in the pixel P more than that of the organic electroluminescence display device which does not have this configuration, by having this configuration. Furthermore, since the length $d_3$ of the adjacent portion across the boundary B between the outer peripheries $E_1$ of the adjacent light emitting regions E (the long side $L_1$ and the short side $L_2$) across the boundary B can be short, it is possible to achieve the effect of the invention without decreasing light emitting efficiency.

Figure 4:
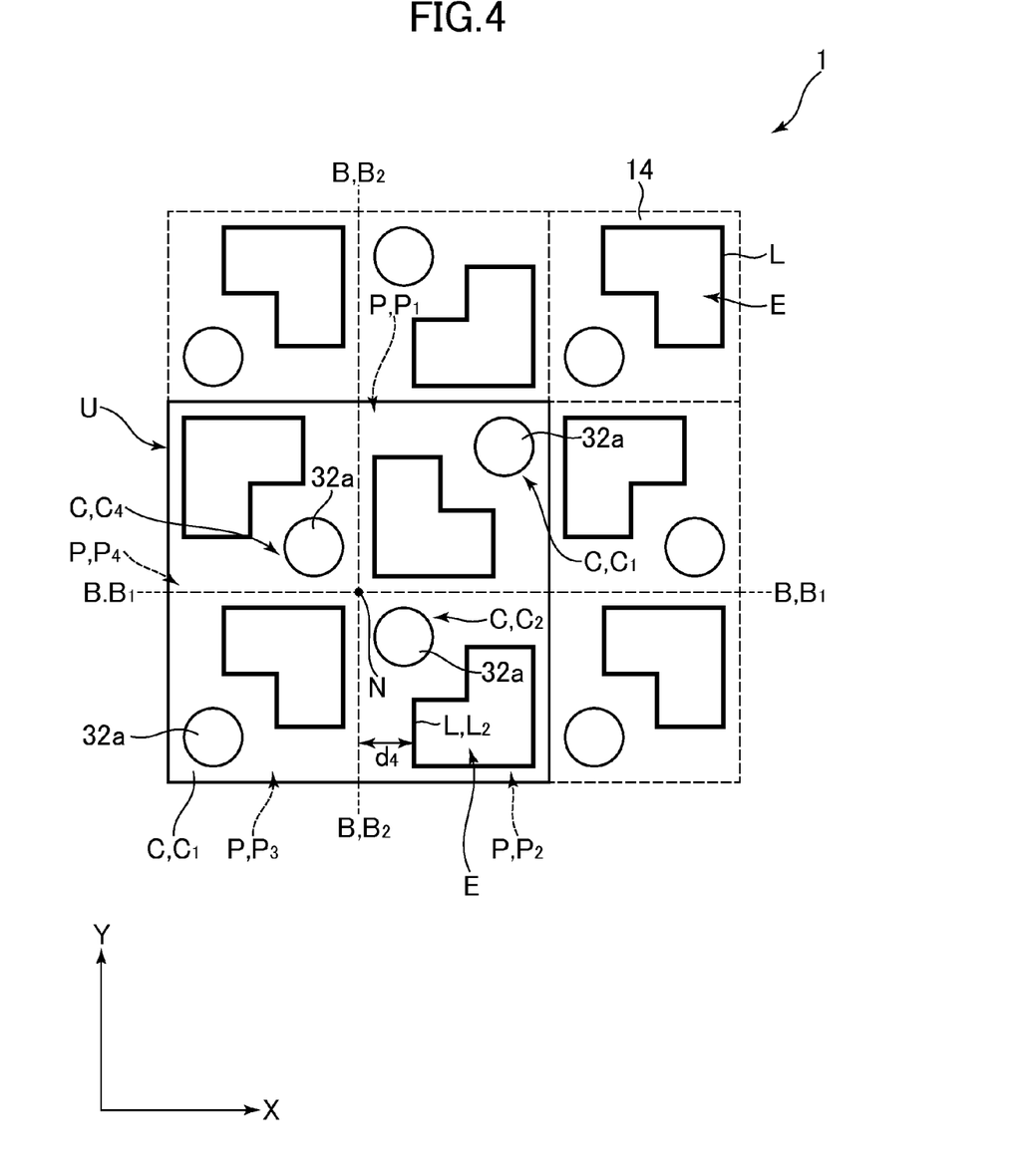
FIG. 4 is a partial enlarged view of a modified example of the organic electroluminescence display device according to the embodiment in the same visual field as that of FIG. 1.

FIG. 4 is a partial enlarged view of a modified example of the organic electroluminescence display device 1 according to the embodiment in the same visual field as that of FIG. 1. If the shape of the light emitting region E in a plan view is the L shape, it is preferable that a distance $d_4$ from the boundary B to the short side $L_2$ be increased as long as the ratio of the area of the light emitting region E in the pixel P is a predetermined value or greater.

In the organic electroluminescence display device 1 having this configuration, the distance $d_4$ from the boundary B to the short side $L_2$ is increased more than that of an organic electroluminescence display device which does not have this configuration. Thus, it is possible to suppress that the light emitted from the light emitting region E is reflected on the side surface L of the pixel separation film 14 and reaches the adjacent pixel P. Thus, it is possible to realize suppression of the color mixture of the organic electroluminescence display device 1.

Figure 5:
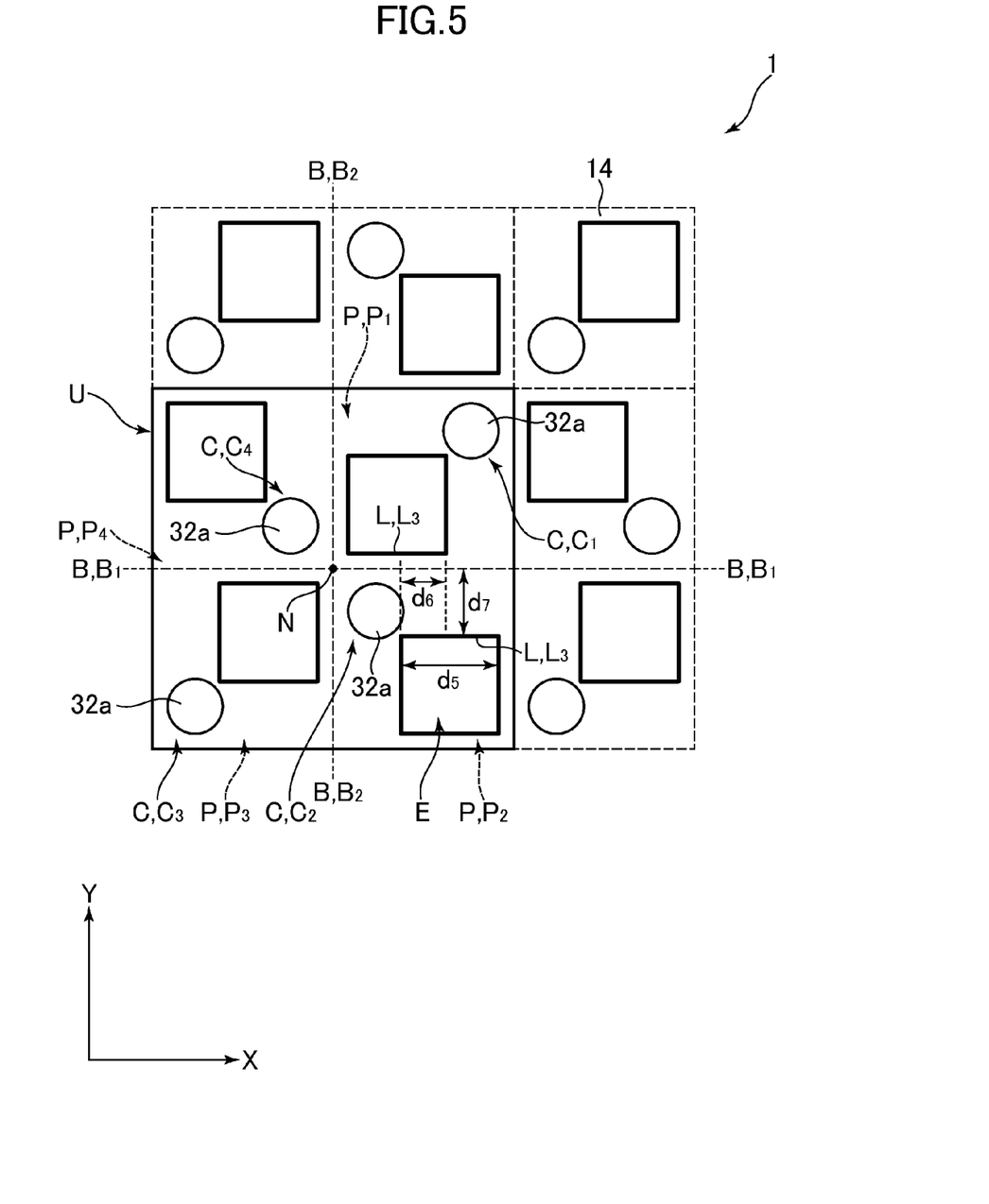
FIG. 5 is a partial enlarged view of a modified example of the organic electroluminescence display device according to the embodiment in the same visual field as that of FIG. 1.

Moreover, the shape of the light emitting region E in a plan view is not limited to the L shape as illustrated in FIG. 3 and it may be other shapes. FIG. 5 is a partial enlarged view of a modified example of the organic electroluminescence display device according to the embodiment in the same visual field as that of FIG. 1.

The shape of the light emitting region E in a plan view may be a rectangular shape as illustrated in FIG. 5. When a length of one side $L_3$ of the outer periphery $E_1$ of the light emitting region E is referred to as $d_5$ and a distance adjacent between side surfaces L (sides $L_3$) of the pixel separation films 14 of the adjacent pixels P across the boundary B is referred to as $d_6$, $d_5 > d_6$ is satisfied.

In the organic electroluminescence display device 1 in the embodiment, the length $d_6$ of an adjacent portion across the boundary B between the outer peripheries $E_1$ (between the sides $L_3$) of the light emitting regions E of adjacent pixels P across the boundary B is shorter than that of the organic electroluminescence display device which does not have this configuration, by having this configuration.

In the organic electroluminescence display device 1 in the embodiment, a distance $d_7$ from the boundary B to the side $L_3$ is increased more than that of the organic electroluminescence display device having the light emitting region E of which the shape in a plan view is the L shape. Thus, it is possible to suppress that the light is reflected on the side surface L of the pixel separation film 14 and reaches the adjacent pixel P and to realize suppression of the color mixture of the organic electroluminescence display device 1.

Figure 6:
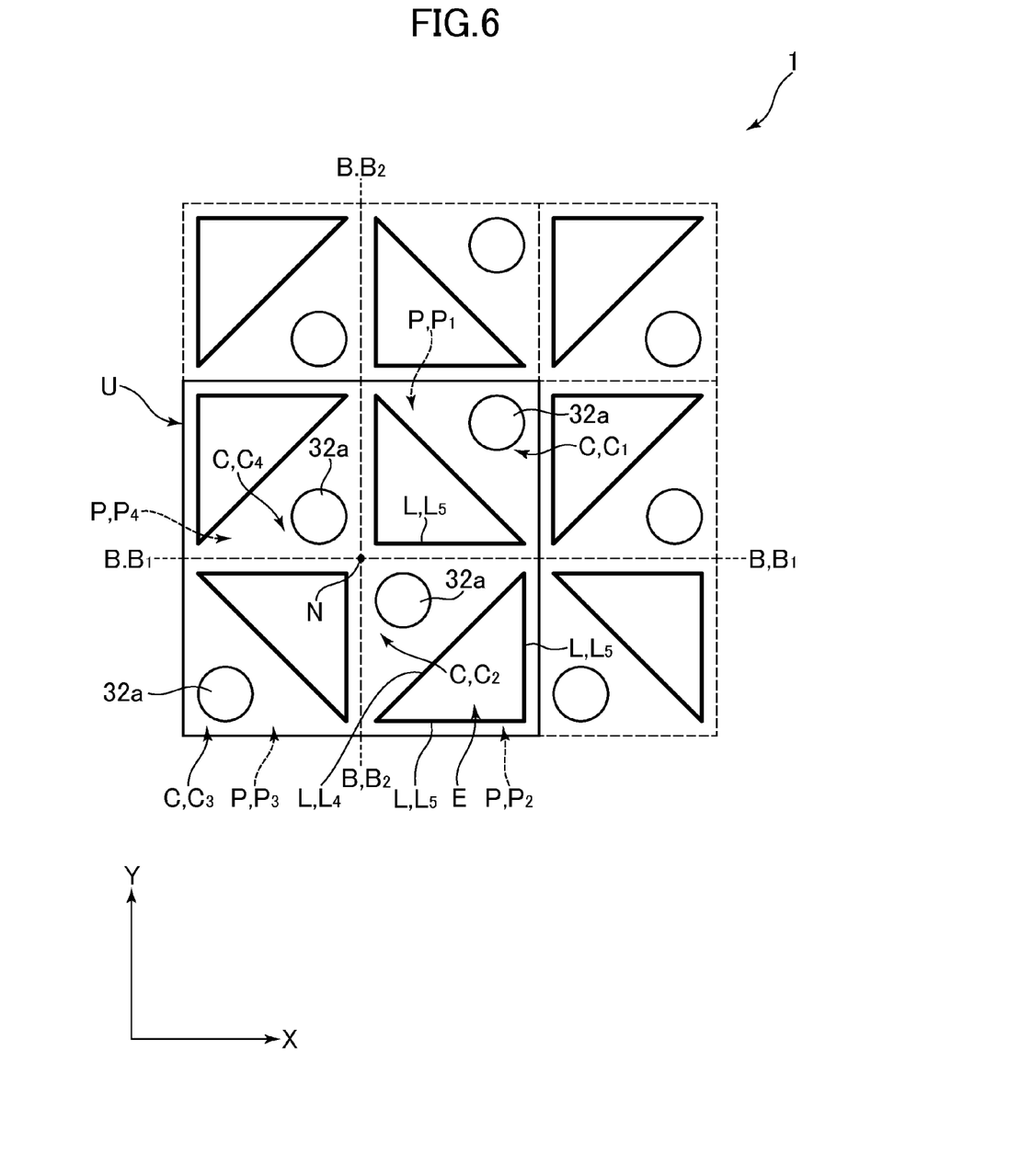
FIG. 6 is a partial enlarged view of a modified example of the organic electroluminescence display device according to the embodiment in the same visual field as that of FIG. 1.

Furthermore, the shape of the light emitting region E in a plan view may be a triangular shape and it is preferable that the shape be a right-angled triangular shape to fit the shape of the pixel P in a plan view. FIG. 6 is a partial enlarged view of a modified example of the organic electroluminescence display device 1 according to the embodiment in the same visual field as that of FIG. 1. Hereinafter, the organic electroluminescence display device 1 having the light emitting region E of which the shape in a plan view is a right-angled isosceles triangular shape is described as an example.

When the longest side of the outer periphery $E_1$ of the light emitting region E illustrated in FIG. 6 is referred to as an inclined side $L_4$ and the other two sides are referred to as a side $L_5$, the sides $L_5$ between adjacent light emitting regions E are not adjacent (disposed in parallel) across the boundary B. Thus, even if the light emitted from the light emitting region is reflected on the side surface L of the pixel separation film 14 formed along the inclined side $L_4$ and the side $L_5$, the light is prevented from reaching the adjacent pixel P. Thus, it is possible to realize suppression of the color mixture of the organic electroluminescence display device 1.

Above, the embodiments of the invention are described, but the invention is not limited to the embodiments described above. For example, the configuration described in the above embodiments may be replaced by a substantially same configuration, a configuration that achieves the same effects, or a configuration that can achieve the same object.

While what are at present considered to be certain embodiments of the invention have been described, it will be understood that various modifications may be made thereto, and it is intended that the appended claim cover all such modifications as fall within the true spirit and scope of the invention.

What is claimed is:

1. An organic electroluminescence display device comprising:
   a substrate;
   a thin film transistor that is formed on the substrate;
   a light emitting region that has a lower electrode, a light emitting layer, and an upper electrode formed for each of a plurality of pixels arranged in a matrix shape on the thin film transistor; and
   contact holes, each of which is formed on the outside of the light emitting region in one corner portion of the pixel and connects the thin film transistor and the lower electrode for each pixel in a plan view,
   wherein the plurality of pixels include a first pixel, a second pixel, and a third pixel,
   the first pixel includes a first contact hole at a first corner portion, the second pixel is adjacent to the first pixel in a first direction and includes a second contact hole at a second corner portion that is offset from the first corner portion in a second direction, the third pixel is adjacent to the first pixel in the second direction and includes a third contact hole at a third corner portion that is offset from the first corner portion in the first direction, wherein the third corner portion is offset from the second corner portion in the second direction, the first corner portion has a first boundary perpendicular to the first direction and a second boundary parallel to the first direction, the second corner portion has a third boundary perpendicular to the first direction and a fourth boundary parallel to the first direction, the third corner portion has a fifth boundary perpendicular to the second direction and a sixth boundary parallel to the second direction, the first boundary and the third boundary share an interface with respect to the first pixel and the second pixel, respectively, and the second boundary and the fifth boundary share an interface with respect to the first pixel and the third pixel, respectively; and wherein each pixel has only one contact hole.

2. The organic electroluminescence display device according to claim 1,
wherein the first direction is perpendicular to the second direction.

3. The organic electroluminescence display device according to claim 1,
wherein the light emitting region is an L shape in a plan view.

4. The organic electroluminescence display device according to claim 1,
wherein the light emitting region is a rectangular shape in a plan view.

5. The organic electroluminescence display device according to claim 1,
wherein the light emitting region is a triangular shape in a plan view.

* * * * *